(12) United States Patent
Rakes

(10) Patent No.: US 9,559,680 B2
(45) Date of Patent: Jan. 31, 2017

(54) ISOLATED HIGH SPEED SWITCH

(71) Applicant: Keithley Instruments, Inc., Cleveland, OH (US)

(72) Inventor: Kyle K. Rakes, Lyndhurst, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 98 days.

(21) Appl. No.: 14/522,838

(22) Filed: Oct. 24, 2014

(65) Prior Publication Data

US 2015/0222257 A1    Aug. 6, 2015

Related U.S. Application Data

(60) Provisional application No. 61/936,568, filed on Feb. 6, 2014.

(51) Int. Cl.
| | |
|---|---|
| *H03K 17/0412* | (2006.01) |
| *H03K 17/687* | (2006.01) |
| *H03K 17/689* | (2006.01) |
| *H03K 17/0416* | (2006.01) |
| *H03K 17/785* | (2006.01) |
| *H03K 17/081* | (2006.01) |

(52) U.S. Cl.
CPC .. *H03K 17/04123* (2013.01); *H03K 17/04163* (2013.01); *H03K 17/689* (2013.01); *H03K 17/6871* (2013.01); *H03K 17/6877* (2013.01); *H03K 17/785* (2013.01); *H03K 17/08104* (2013.01)

(58) Field of Classification Search
CPC ............ H03K 17/04123; H03K 17/785; H03K 17/04163; H03K 17/6877; H03K 17/6871; H03K 17/689; H03K 17/08104

USPC ......................................... 327/434, 436, 437
See application file for complete search history.

(56) References Cited

U.S. PATENT DOCUMENTS

| | | | |
|---|---|---|---|
| 4,581,540 A | 4/1986 | Guajardo | |
| 5,118,966 A * | 6/1992 | Kumada | G01R 29/24 327/100 |
| 7,088,150 B2 * | 8/2006 | Balhiser | H03K 19/01707 327/108 |
| 2009/0014669 A1 | 1/2009 | Sato et al. | |

FOREIGN PATENT DOCUMENTS

| | | |
|---|---|---|
| JP | 2006165283 A | 6/2006 |
| JP | 2009004522 A | 1/2009 |

OTHER PUBLICATIONS

Extended European Search Report for European Patent Application No. 15154079.6, dated Jun. 18, 2015, 8 pages.

* cited by examiner

*Primary Examiner* — Kenneth B Wells
(74) *Attorney, Agent, or Firm* — Marger Johnson

(57) ABSTRACT

A circuit structured to drive an isolated high speed voltage metal-oxide-semiconductor field-effect transistor (MOSFET) switch, including a first MOSFET and a second MOSFET configured to operate as a switch, a capacitor, a charging component in parallel with the capacitor, a first switch in series with the charging component, and a second switch in parallel with the charging component and the capacitor. The stored voltage in the capacitor is sent to the gates of the first MOSFET and the second MOSFET when a second switch is open and a first switch is closed.

10 Claims, 2 Drawing Sheets

ISOLATED HIGH SPEED SWITCH

PRIORITY

This application claims priority to U.S. Provisional Application No. 61/936,568 filed Feb. 6, 2014, which is hereby incorporated by reference in its entirety.

TECHNICAL FIELD

This disclosure relates to an isolated high speed MOSFET switching circuit capable of switching on lower on resistance MOSFETs at an acceptable rate.

BACKGROUND

An isolated MOSFET switching circuit, as seen in FIG. 1, uses an opto-battery 100, as described in more detail below, to provide isolation and power to the gates of the drive metal-oxide-semiconductor field-effect transistors (MOSFET) 102 and 104, forcing the MOSFETs 102 and 104 to turn on. MOSFETs 102 and 104 are high voltage MOSFETs. These MOSFETs have a gate-source capacitance, shown as capacitors 106 and 108 for clarity in FIG. 1, and also referred to as capacitors Ca and Cb, respectively. To turn the isolated MOSFET switching circuit in FIG. 1 on, switch 110 closes to provide 10-15 mA of current through the light emitting diode (LED) 112 of the opto-battery 100. The light from the LED causes a small current (e.g., 10-30 µA) to flow in the current source of the opto-battery 100. The current flows into capacitors 106 and 108, increasing the voltage across them at a rate of $dV/dt=i/(Ca+Cb)$. This rate continues until the zener-diode 114 zeners, which is around 6V, and begins stealing current from opto-battery 100, limiting the voltage to 6V. As the voltages on the capacitors and gate-source of the MOSFETs 102 and 104 increase the MOSFETs 102 and 104 turn on. As the MOSFETs 102 and 104 turn on, the gate-drain voltage of each of the MOSFETs 102 and 104 begins to change, causing some gate current to flow into the gate-drain capacitance. The gate-drain capacitance of the MOSFETs 102 and 104 also affects the charging and turn-on speed of the MOSFETs 102 and 104. The longer it takes to energize these collective gate-source capacitances to 6V, the longer it takes to turn on the isolated MOSFET switching circuit. Further, the voltage could be much higher for the gate-drain capacitances, also increasing the switching time.

Phototransistor 116 in FIG. 1 is optional and used when the isolated MOSFET switching circuit is part of a protection circuit. When the switching circuit should protect, Phototransistor 116 will begin to reduce the gate-source voltages of MOSFETs 102 and 104 and begin to open the switch circuit. MOSFETs 102 and 104 are in the linear region when the circuit is in the protection mode. Phototransistor 116 must handle the current of de-energizing the MOSFETs 102 and 104 capacitances 106 and 108 from 6V to the voltage necessary for protection.

To turn off the switching circuit of FIG. 1, switch 110 opens, cutting off current to the LED 112, and opto-battery 100. A resistor in parallel with the current source (not shown for simplicity) discharges gate capacitances 106 and 108, eventually lowering the gate-source voltage of MOSFETs 102 and 104 and turning off the switch circuit.

Newer MOSFETs, however, typically have a high gate capacitance, and the switching circuit shown in FIG. 1 is slow to switch on these newer MOSFETs due to the higher gate capacitance.

One alternative to correct for the slow switching of the newer MOSFETs is to use a gate isolation transformer. The gate isolation transformer provides the required gate current to quickly switch on the MOSFET switching circuit. However, the gate isolation transformer requires complicated drive circuitry for the transformer, as well as a large and costly transformer itself. Another alternative is to include a floating power supply in the design using another winding on a supply transformer. The winding provides the high current at high signal voltages. Although this type of design is less complicated than adding a gate isolation transformer, it is still a major redesign and added cost.

The disclosed technology addresses these limitations of the prior art.

SUMMARY

Embodiments of the disclosed technology include a circuit structured to drive an isolated high speed metal-oxide-semiconductor field-effect transistor (MOSFET) switch, including a first MOSFET and a second MOSFET configured to operate as a switch, a capacitor, an opto-battery in parallel with the capacitor, a first switch in series with the opto-battery, and a second switch in parallel with the opto-battery and the capacitor.

DETAILED DESCRIPTION

Figure 1:
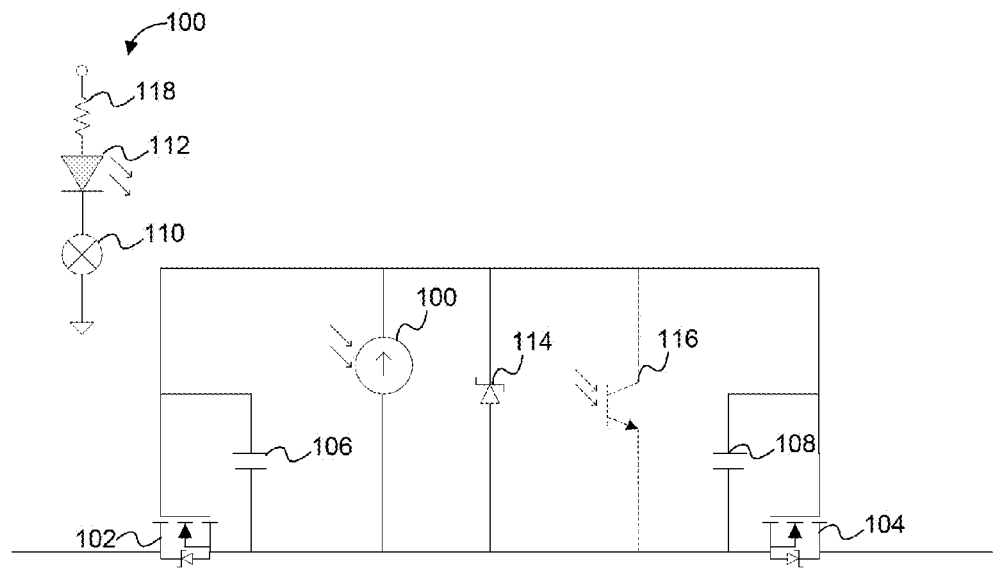
FIG. 1 is a conventional isolated MOSFET switching circuit.

In the drawings, which are not necessarily to scale, like or corresponding elements of the disclosed systems and methods are denoted by the same reference numerals.

The isolated MOSFET switching circuit of FIG. 1 was fast enough for the original MOSFETs used in the circuit, however, these older MOSFETs have become obsolete. The trend for replacement parts is to have a lower on resistance for MOSFETs. Lower on resistance means less loss in the MOSFET when high currents are flowing, so higher efficiency circuits can be designed. To achieve the lower on resistance, MOSFET manufacturers increase the size of the silicon die. This size increase causes a significant increase in gate capacitance—an order of magnitude greater for the gate-source and gate-drain capacitances. This increase in capacitance causes the rate of voltage change to decrease. This decrease in rate increases the time it takes to turn on the switching circuit with the newer MOSFETs.

The disclosed technology includes an isolated high speed MOSFET switching circuit that is capable of switching the newer lower-on-resistance MOSFETs at a much quicker rate. The switching circuit of FIG. 2 includes MOSFETs 202 and 204, with gate capacitances 206 and 208. When MOSFETs 202 and 204 are on, the output of the switching circuit is equal to the input and the switching circuit is on. When MOSFETs 202 and 204 are off, the output is not equal to the input and the switching circuit can stand off as much voltage as MOSFET 202 and 204 are rated for individually.

Figure 2:
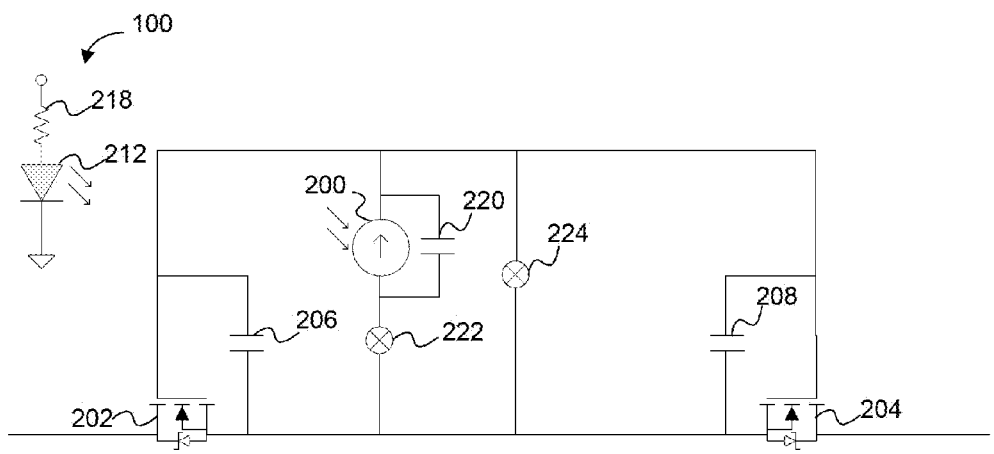
FIG. 2 is an isolated high speed MOSFET switching circuit according to some embodiments of the disclosed technology.

In FIG. 1, since capacitances 106 and 108 are too high and cannot be reduced, the current output to the MOSFETs 102 and 104 must be increased. In the disclosed technology, as shown in FIG. 2, capacitor 220 is used as an energy storage tank to hold energy from a charging component 200 so the energizing time of capacitances of 206 and 208 can be reduced. The charging component 200, may be, for example, an opto-battery. An opto-battery is an isolation device that pushes a current through an LED, which causes the LED to shine on a set of diodes, which in turn produces a small current, which is isolated from the current through the LED. Opto-batteries are also known as photocouplers. However, the charging component 200 can be any component capable of charging capacitor 220.

Switch 110, shown in FIG. 1, has been removed from the circuit in FIG. 2, so whenever power is applied to the system, charging component 200 is providing current. That is, charging component 200 constantly provides current to the switching circuit. When the switching circuit is off, that is, the output does not equal the input, switch 222 is open so all of the current from charging component 200 goes into energizing capacitor 220. Capacitor 220 is much larger than capacitances 206 and 208. That is, typical values of capacitances 206 and 208 are on the order of 1 nF, while capacitor 220 is on the order of 10 μF. Capacitor 220 may be a couple orders of magnitude greater than capacitors 206 and 208. For example, the capacitor 220 may be anywhere from 0.1 μF to 100 μF. Preferably, capacitor 220 is 10 μF.

When the system requires the switching circuit to be on, switch 224 opens and switch 222 closes. This connects capacitor 220 in parallel with capacitances 206 and 208. Since capacitor 220 is energized and capacitances 206 and 208 are not, current flows out of capacitor 220 and into the MOSFET capacitances 206 and 208. Capacitor 220 therefore acts as a low impedance source, since there is only a small resistance in switch 222 and the printed circuit board traces. This limited resistance causes current on the order of amps to flow, so capacitors 206 and 208 charge quickly. Because capacitor 220 is much larger than capacitors 206 and 208, the voltage on capacitor 220 decreases only slightly. The result is that the MOSFETs 202 and 204 turn on very quickly.

The high turn on current is provided solely by capacitor 220. After the switching circuit is on, charging component 200 replaces the energy lost in the transfer to capacitors 206 and 208, and this increases the voltage on capacitor 220 back to what it was before the switching circuit turned on.

Figure 3:
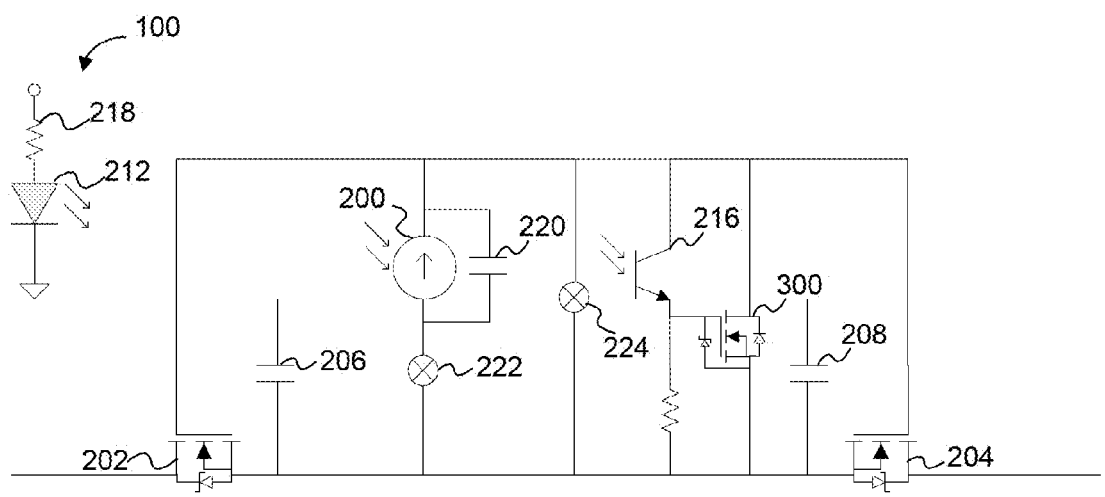
FIG. 3 is another isolated high speed MOSFET switching circuit according to some embodiments of the disclosed technology.

FIG. 3 illustrates the circuit of FIG. 2 with the added protection of phototransistor 216. In this circuit, however, phototransistor 216 must drain the energy from capacitor 220 to turn off the MOSFETs 202 and 204. This may slow down the protection circuit's reaction time. To improve the reaction time, a transistor 300 is added to the switching circuit, as shown in FIG. 3. The transistor 300 quickly drains MOSFET 202 when protection is needed. When protection is no longer needed, charging component 200 must re-energize capacitor 220. This re-energizing of capacitor 220, however, may take a significant amount of time, meaning that it may take longer for the switching circuit to resume normal operation after the protection circuit has been engaged due to an overload of the switching circuit.

The circuits of FIGS. 2 and 3 are turned off by opening switch 222 and closing switch 224. Switch 224 is required because in the original circuit of FIG. 1, the resistance in opto-battery 100 is used to drain capacitances 106 and 108 to turn off the MOSFETs 102 and 104, and with switch 222 open, there is no path to drain capacitances 206 and 208. Switch 222 must be opened first, however, or switch 224 will short out capacitor 220, and the stored energy needed for the speed improvement will be lost. Switch 224 has the advantage of quickly turning off the switching circuit because it offers much less resistance than the resistor used in FIG. 1.

The zener-diode 114 shown in FIG. 1 has been removed from the circuits of FIGS. 2 and 3. If the zener-diode 114 was still in the circuit, capacitor 220 would provide current to the zener-diode 114 until the voltage is lowered to 6V. This voltage drop would reduce the switching frequency by draining energy stored for future switching actuations. The original purpose of the zener-diode 114 was to protect MOSFETs 102 and 104 from electrostatic discharge, and to create a more consistent switch turn off since the gate source was limited to the zener voltage.

However, with the disclosed technology, this protection is no longer required. MOSFETs 202 and 204 have built in 20V zener protection diodes. Since the opto-battery is limited to 10 v, the built-in zener protection diodes are only useful for protection.

Switches 222 and 224 in FIGS. 2 and 3 are optically isolated transistors, driven by LEDs (not shown). A digital signal provides current to the LED, which shines on the transistor to turn on the switch. Switches 222 and 224 require 10 mA of continuous current through the LEDs to operate, but the switch turn-on time is relatively slow at 10 mA. Accordingly, a circuit (not shown) can be added to the LED driver to create a brief 100 mA pulse to the LED before reducing the drive to 10 mA. The 100 mA pulse quickly turns on switch 222 or switch 224, and then 10 mA continuous current keeps the switch on, further reducing overall switching time.

The disclosed technology allows the switch circuit to use newer MOSFETs with lower on resistance to switch the isolated high speed MOSFET switching circuit on at an acceptable rate.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A circuit structured to drive an isolated high speed metal-oxide-semiconductor field-effect transistor (MOSFET) switch, comprising:
    a first MOSFET and a second MOSFET configured to operate as a MOSFET switch;
    a capacitor;
    a first circuit formed by a charging component in parallel with the capacitor, wherein the charging component is configured to provide energy to the capacitor;
    a first switch in series with the first circuit; and
    a second switch in parallel with a second circuit formed by the series connection of the first switch and the first circuit.

2. The circuit of claim 1, wherein the first switch is open and the second switch is closed when the MOSFET switch is off.

3. The circuit of claim 1, wherein the second switch is open and the first switch is closed when the MOSFET switch is on.

4. The circuit of claim 1, wherein the charging component includes an opto-battery.

5. The circuit of claim 1, wherein the stored voltage in the capacitor is sent to the gates of the first MOSFET and the second MOSFET when the second switch is open and the first switch is closed.

6. The circuit of claim 5, further including a protection circuit, the protection circuit including a third MOSFET and a transistor in parallel with the second circuit.

7. The circuit of claim 6, wherein the protection circuit is configured to drain energy from the capacitor when the switching circuit is overloaded.

8. A circuit structured to drive an isolated high speed metal-oxide-semiconductor field-effect transistor (MOSFET) switch, comprising:
   a first MOSFET and a second MOSFET configured to operate as a MOSFET switch;
   a capacitor;
   a first circuit formed by a charging component in parallel with the capacitor;
   a first switch in series with the first circuit;
   a second switch in parallel with the a second circuit formed by the series connection of the first switch and the first circuit; and
   a protection circuit including a third MOSFET and a transistor in parallel with the second circuit.

9. The circuit of claim 8, wherein the protection circuit is configured to drain energy from the capacitor when a switching circuit is overloaded.

10. A method of accelerating switching of an isolated high speed metal-oxide-semiconductor field-effect transistor (MOSFET) switch, the switch including a first MOSFET and a second MOSFET configured to operate as a MOSFET switch, and a charging component, the method including:
   storing charge in the form of voltage on a capacitor which is in parallel with the charging component which provides energy, from the charging component to the capacitor, such that the stored voltage and charge is greater than the amount necessary to charge the MOSFETs beyond their thresholds, the parallel combination of the capacitor and the charging component forming a first circuit; and
   applying the charge on the capacitor to the MOSFETs through a first switch in series with the first circuit while a second switch which is in parallel with a second circuit formed by the first switch in series with the first circuit is open.

* * * * *